United States Patent
Tsukamoto et al.

(10) Patent No.: US 6,809,357 B2
(45) Date of Patent: Oct. 26, 2004

(54) FLAT PANEL DETECTION TYPE SOLID-STATE IMAGING DEVICE

(75) Inventors: Akira Tsukamoto, Otawara (JP); Manabu Tanaka, Nasu-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/358,338

(22) Filed: Feb. 5, 2003

(65) Prior Publication Data

US 2003/0146990 A1 Aug. 7, 2003

(30) Foreign Application Priority Data

Feb. 6, 2002 (JP) ........................................ 2002-029907

(51) Int. Cl.[7] ............................................. H01L 31/062
(52) U.S. Cl. ...................... 257/291; 257/184; 257/187; 257/292; 257/293; 257/432; 257/462
(58) Field of Search ............................ 257/184–7, 203, 257/221, 291–3, 433, 461–2; 349/38–9, 45–7

(56) References Cited

U.S. PATENT DOCUMENTS 6,069,393 A * 5/2000 Hatanaka et al. ........... 257/434
6,323,490 B1    11/2001 Ikeda et al.
6,433,842 B1 *  8/2002 Kaneko et al. ............... 349/43

FOREIGN PATENT DOCUMENTS

JP           2000-243558           9/2000

* cited by examiner

*Primary Examiner*—Long Pham
*Assistant Examiner*—Wai-Sing Louie
(74) *Attorney, Agent, or Firm*—Oblon, Spivak, McClelland, Maier & Neustadt, P.C.

(57) ABSTRACT

A TFT array structure formed on a glass substrate employs an aluminum alloy for the wiring patterns of signal lines and scanning lines. Besides, on the glass substrate, a terminal structure is formed near the terminating end of each of the wiring patterns. The terminal structure includes a terminal pattern which is formed of the same MoW layer as that of capacitor lines of the TFT array structure. Thus, the TFT array structure holds a repair facility equal to that of the prior art while realizing the enhancement of an operating speed and the reduction of image noise owing to the lowered resistances of the scanning lines and signal lines.

15 Claims, 5 Drawing Sheets

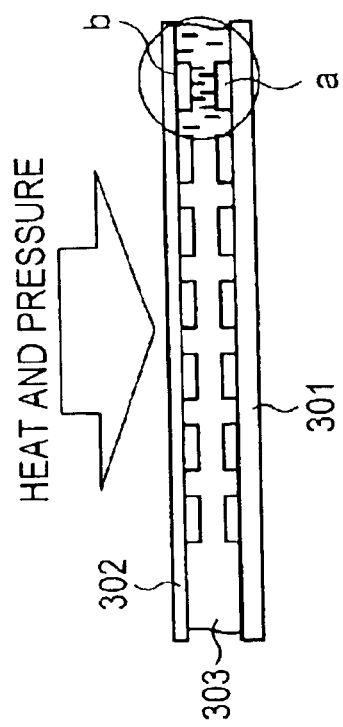
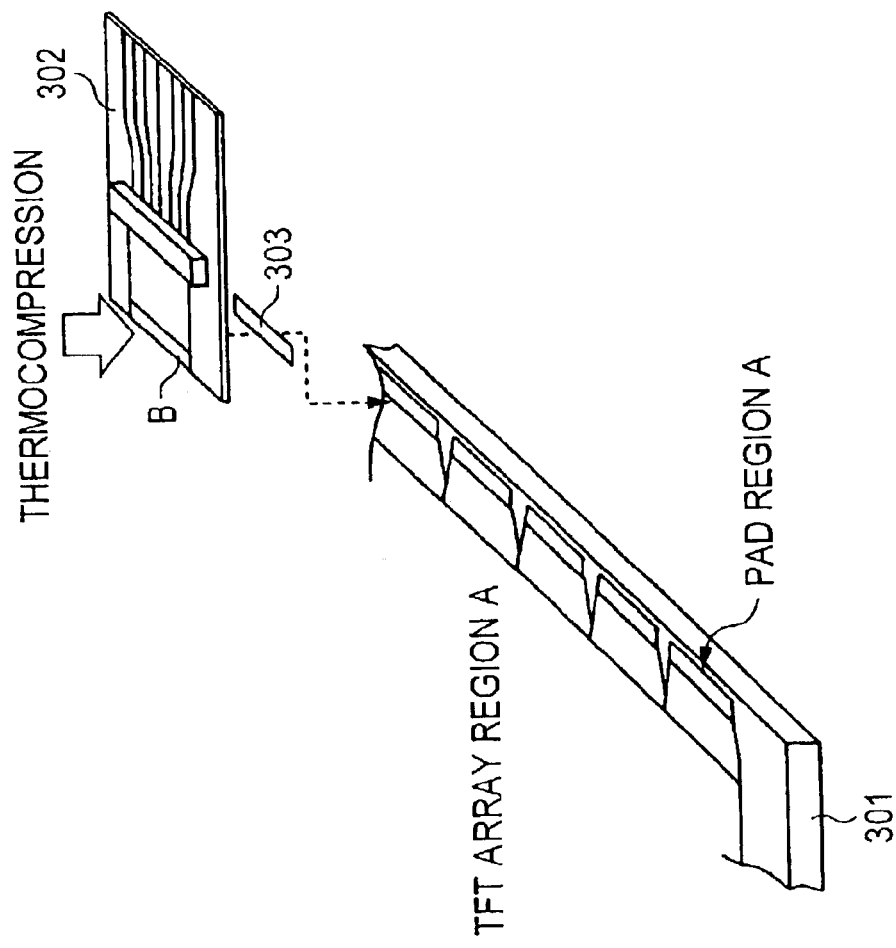
FIG. 3B
FIG. 3A

FLAT PANEL DETECTION TYPE SOLID-STATE IMAGING DEVICE

CROSS-REFERENCE TO RELATED APPLICATIONS

This application is based upon and claims the benefit of priority from the prior Japanese Patent Application No. 2002-029907, filed Feb. 6, 2002, the entire contents of which are incorporated herein by reference.

BACKGROUND OF THE INVENTION

1. Field of the Invention

The present invention relates to a solid-state imaging device of flat panel detection type in which photoelectric conversion pixels are arrayed in the shape of a matrix, and which is applied to, for example, an X-ray diagnosis apparatus for medical treatment.

2. Description of the Related Art

In recent years, in the field of medical treatment, the medical data of patients have been databased for the purpose of performing therapies promptly and accurately. Databasing has been required also for the image data of X-ray radiography, and the digitization of X-ray radiographic images has been desired. Since, however, the images are radiographed with a silver halide film in a conventional X-ray diagnosis apparatus for medical treatment, the digitization thereof needs to be implemented in such a way that, after the radiographed film has been developed, it is further scanned by a scanner or the like so as to convert the images into electric signals, followed by a digital process. Accordingly, labor and time are expended on the digitization of the images. Therefore, a system wherein the images are directly digitized using a CCD (charge coupled device) imager of one inch square or so has recently been put into practical use.

In this regard, in a case where the lungs of a subject, for example, are to be radiographed, an area necessary for the radiography is as large as about 43 cm×43 cm. Therefore, an optical apparatus for condensing the light of the whole area onto the CCD imager is necessitated, and the inevitable large size of the apparatus becomes a problem. A solid-state imaging device of flat panel detection type has been proposed as means for solving the problem. As an example of the device, an X-ray imaging device called "flat panel X-ray detector" is proposed in U.S. Pat. No. 4,689,487.

The above solid-state imaging device of flat panel detection type is characterized by employing a-SiTFTs (amorphous silicon thin-film transistors) as the control elements of photoelectric conversion pixels. Now, the structure of this device will be briefly explained.

A flat substrate made of a glass material is employed for the device. An insulating layer made of a silicon oxide film is formed on the substrate, and photoelectric conversion pixels each consisting of a capacitor, a TFT and an X-ray/charge conversion film are formed in the shape of a matrix on the insulating layer. Further, there are formed the wiring patterns of scanning lines for feeding switching control signals to the TFTs of the respective pixels arrayed in the row direction of the matrix, and the wiring patterns of signal lines for sequentially transferring stored charges read out from the respective pixels arrayed in the column direction. The substrate is called "TFT array substrate".

With the device of the above construction, in each of the pixels, a bias voltage is applied to a capacitor forming portion through a capacitor line beforehand, and charges generated by the X-ray/charge conversion film are stored in the capacitor. The TFTs of the respective pixels are sequentially driven to turn ON through the scanning lines laid in row units, whereby the stored charges of the pixel capacitors are sequentially derived to the signal lines laid in column units. The stored charges of the individual pixels derived to the respective signal lines are amplified, and are digitally outputted. Thus, image data based on all the pixels can be obtained.

In the TFT array substrate, terminals for connections with circuit devices such as drive circuits, an amplification circuit and a power source circuit, which are prepared separately from the substrate itself, are formed at the respective terminating ends of the scanning lines, signal lines and capacitor lines. The terminals are put together by every predetermined number (each terminal shall be called a "PAD", and the group of the terminals put together (the collection of PADs) shall be called a "PAD group"). By way of example, the terminals are arranged at a high density under the conditions of a terminal width of 60 $\mu$m and a terminal pitch of 100 $\mu$m.

A technique called "TAB (Tape Automated Bonding) connection" is employed for connecting the terminals and the circuit devices. The TAB connection implements the electrical connections among the terminals arranged at the high density, in such a way that a PAD region on the TFT array substrate and a PAD region on the side of a flexible circuit board, which is called a tape carrier package (TCP) and on which the circuit devices are mounted (hereinbelow, the circuit board shall be termed the "TCP"), are bonded by thermocompression bonding through an anisotropic conductive film (ACF) of thermosetting type.

Since the TFT array substrate is very expensive, it needs to be repaired at the time when any misconnection with the TCP has occurred. A repairing method in this case is such that the TCP thermally secured is torn off from the TFT array substrate, that the ACF secured on the surface of the substrate is removed with a solvent or the like, and that the substrate and the TCP which have been properly connected are bonded again by the thermocompression bonding through an ACF. In the prior art, therefore, the whole wiring patterns which include terminal forming portions are formed of a material which is difficult to peel off the substrate at the tearing-off of the TCP or at the removal of the ACF, for example, molybdenum-tungsten (MoW) which is used for the capacitor lines. Besides, a transparent conductive film of indium tin oxide (ITO) or the like is stacked as a protective layer on the terminal forming portions.

Meanwhile, an image of high definition and the reduction of image noise are required of the above solid-state imaging device of the flat panel detection type. For meeting the requirements, it is indispensable to lower the resistance of each signal line forming a factor for the image noise, and to reduce a capacitance parasitic to the signal line. It is desirable for the decrease of the parasitic capacitance of the signal line to fine the line width of each scanning line which intersects orthogonally to the signal line, and the use of a material of low resistance is mentioned as means for fining the scanning line with a predetermined driving speed satisfied. For attaining the lower resistances of the scanning line and the signal line, it is desirable to use, for example, an aluminum alloy.

The material such as aluminum alloy, however, weakly couples with the silicon oxide film. The terminals for the TAB connection are formed at the terminating ends of the wiring patterns which form the scanning lines and the signal lines. Therefore, in a case where the aluminum alloy is used as the material of the wiring patterns, even the wiring layers are peeled off at the removal of the ACF. For this reason, a new terminal structure of the TFT array substrate is demanded in points of facilitating the repair and improving the characteristics of the imaging device.

Incidentally, a technique which employs an aluminum alloy as a wiring material for elements arrayed in the shape of a matrix is proposed in Japanese Patent Laid-Open No. 2000-243558. The technique disclosed in the cited reference is as stated below.

With the object of raising a scanning drive speed simultaneously with heightening an integration density, the wiring patterns of scanning lines and signal lines for light emitting display elements are formed of the aluminum alloy. The terminating ends of the wiring patterns are shaped into terminals for connections with external circuit devices. The whole substrate except terminal portions are tightly sealed. On this occasion, when the aluminum alloy is exposed the terminal portion is corroded by oxidation. Therefore, the terminal portions are covered with protective films made of a material such as molybdenum.

The technique disclosed in the cited reference relates to a light emitting display, and differs in the technical field from the flat panel type solid-state imaging device of the present invention. Further, it does not implicate at all the demand for facilitating the repair treatment of the substrate. Granted that the substrate is submitted to the TAB connection at the terminal portions indicated in the cited reference, even wiring layers will be peeled off at the removal of an ACF because the terminal portions are made of the aluminum alloy. It is therefore obvious that the object of the present invention to simultaneously satisfy the facility of the repair and the improvements of the characteristics cannot be accomplished by the technique in the cited reference.

BRIEF SUMMARY OF THE INVENTION

As explained above, in the prior-art solid-state imaging device of flat panel detection type, especially image noise is a serious problem, and the reduction of the image noise is eagerly requested. Lowering the resistances of wiring patterns is therefore desired, but the use of a material of low resistance is difficult on account of the restriction of a terminal structure.

An object of the present invention is to provide a flat panel detection type solid-state imaging device including a terminal structure which permits the imaging device to be easily repaired with respect to external circuit devices while realizing the enhancement of an operating speed and the reduction of image noise based on the lowered resistances of wiring patterns.

According to a first aspect of the present invention, there is provided a flat panel detection type solid-state imaging device, comprising a flat substrate; an array structure which is formed on the flat substrate, and which includes a plurality of conversion pixels for converting incident light or an incident radiation into charges and then storing the charges, a first group of wiring patterns for feeding control signals to the conversion pixels, and a second group of wiring patterns for transferring charges read out from the conversion pixels; and terminal structures which are formed on the flat substrate, and each of which includes a terminal pattern for TAB (Tape Automated Bonding) connection which is connected with a terminating end of any of the wiring patterns of the first and second groups of wiring patterns; wherein a first material which couples more intensely than a second material of the wiring patterns in respect of the TAB connection is employed for the terminal patterns, and the second material of the wiring patterns has a resistance lower than that of the first material.

According to a second aspect of the present invention, there is provided a flat panel detection type solid-state imaging device, comprising a flat substrate; an array structure which is formed on the flat substrate, and which includes a plurality of conversion pixels for converting incident light or an incident radiation into charges and then storing the charges, a first group of wiring patterns for feeding control signals to the conversion pixels, and a second group of wiring patterns for transferring charges read out from the conversion pixels; and terminal structures which are formed on the flat substrate, and each of which includes a terminal pattern for TAB (Tape Automated Bonding) connection as is formed at a position near a terminating end of any of the wiring patterns of the first and second groups of wiring patterns; and connection structures which are formed on the flat substrate, and each of which includes a conductive pattern that is stacked on an end part of the terminal pattern and the terminating end of the wiring pattern so as to overlap them partially, and that serves to electrically connect both the terminal pattern and the wiring portion; wherein a first material which couples more intensely than a second material of the wiring patterns in respect of the TAB connection is employed for the terminal patterns, and the second material of the wiring patterns has a resistance lower than that of the first material.

In accordance with the present invention, lower resistances can be realized by optimizing the selection of the material(s) of signal lines or/and scanning lines, whereby the noise of an imaging device is reduced, and the driving speed thereof is enhanced. Besides, a terminal construction can be made equivalent to that of the prior art, so that the repair facility of the imaging device is excellent.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A and 3B are a perspective view and a sectional view showing the TAB connection structure of the flat panel X-ray detector, respectively;

DETAILED DESCRIPTION OF THE INVENTION

Now, embodiments of the present invention will be described in detail with reference to the drawings.

Figure 1:
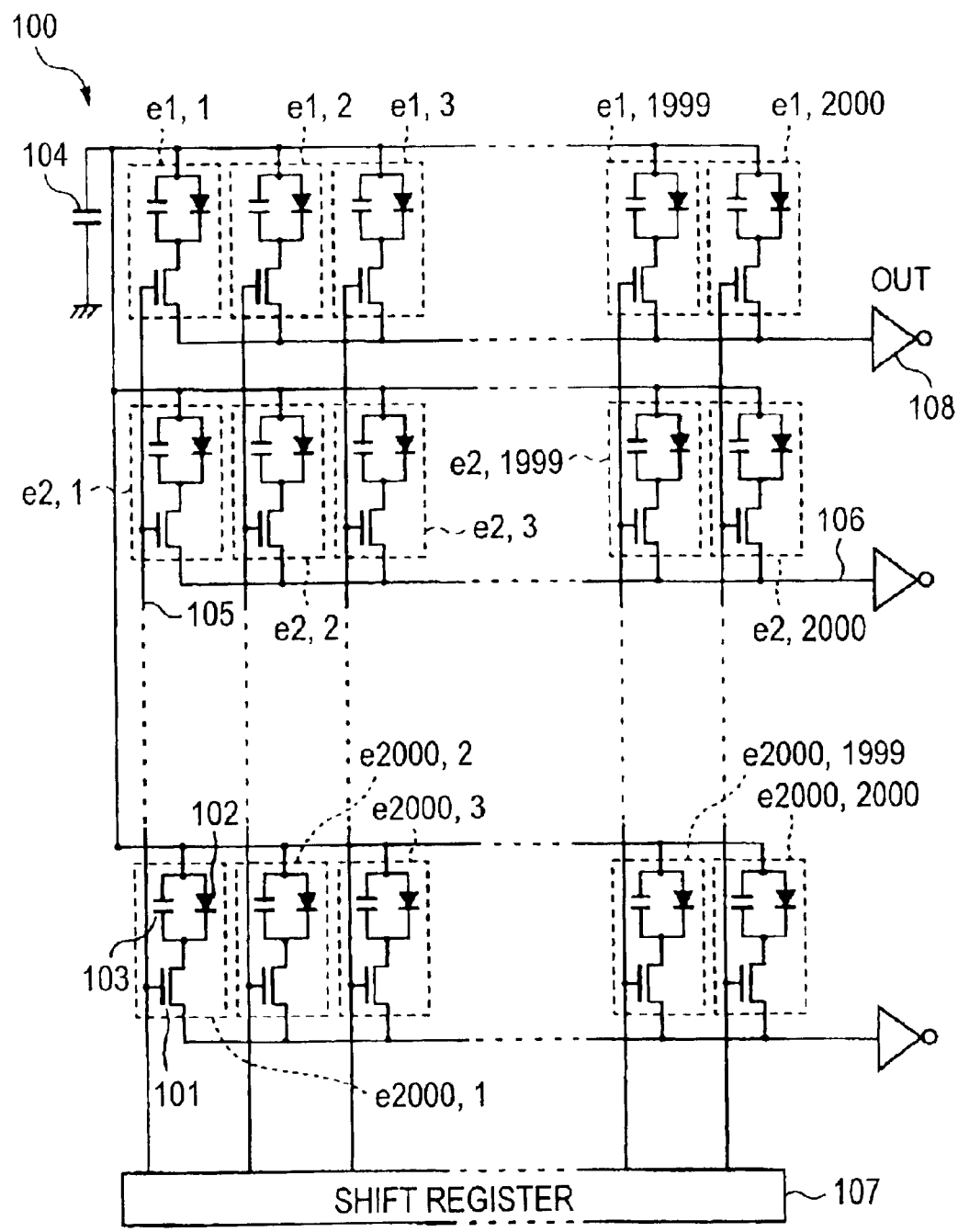
FIG. 1 is a circuit diagram showing the schematic construction of a flat panel X-ray detector which is an embodiment of a solid-state imaging device of flat panel detection type according to the present invention.

FIG. 1 is a circuit diagram showing the schematic construction of a flat panel X-ray detector (X-ray imaging device) which is an embodiment of a solid-state imaging device of flat panel detection type according to the present invention. Referring to FIG. 1, numeral 100 designates a substrate for packaging an imaging portion. Radiation/charge conversion pixels ei,j (i=1–2000, j=1–2000) numbering 2000×2000 as constitute the imaging portion, are arrayed in the shape of a matrix. Each of the conversion pixels ei,j includes an a-SiTFT 101, an X-ray/charge conversion film 102 and a capacitor 103 (hereinbelow, such pixel forming regions shall be called the "TFT array"). In the TFT array, scanning lines 105 are laid in row units, and signal lines 106 are laid in column units.

A bias voltage is applied to the X-ray/charge conversion films 102 and the capacitors 103 through corresponding terminals TA1–TA2000 by a power source circuit 104. Each of the a-SiTFTs 101 has its gate electrode connected to the corresponding scanning line 105, has its drain electrode connected to the corresponding signal line 106, and has its source electrode connected to the pixel electrode of the X-ray/charge conversion film 102 and the capacitor 103.

The terminating ends of the scanning lines 105 are connected to a shift register 107 for driving these scanning lines, through corresponding terminals TB1–TB2000. The terminating ends of the signal lines 106 are respectively connected to amplifiers 108 for detecting signals, through corresponding terminals TC1–TC2000. The a-SiTFTs 101 are controlled to turn ON/OFF by ON/OFF control signals from the shift register 107, and they connect the pixel electrodes to the corresponding signal lines 106 in accordance with the ON signal.

In the flat panel X-ray detector of the above construction, when light (X-rays) is entered, charges are generated in the respective X-ray/charge conversion films 102. The charges are stored in the corresponding capacitors 103. The shift register 107 causes driving currents to flow through the scanning lines 105 laid in row units, from j=1 to j=2000 in succession. On this occasion, all the a-SiTFTs 101 connected to the scanning lines 105 are concurrently turned ON, so that the charges stored in the pixel capacitances 103 are derived to the corresponding signal lines 106. Consequently, the stored charges of the capacitors 103 are led to the signal lines 106 in the order of the array from the pixel of j=1 and are transferred to the amplifiers 108. Since the quantities of charges to be generated differ depending upon the quantities of light entering the X-ray/charge conversion films 102, the output amplitudes of the amplifiers 108 change in pixel units. The output signals of the amplifiers 108 are submitted to A/D conversion, and thus can be directly turned into a digital image.

The flat panel X-ray detector which employs the a-SiTFTs as the control elements of the respective pixels as described above, includes an indirect conversion scheme wherein incident X-rays are converted into visible light rays by a phosphor, and the resulting light rays are converted into charges by the charge conversion films of respective pixels, and also a direct conversion scheme wherein X-rays having entered pixels are directly converted into charges. The kinds of charge conversion films are different between in the flat panel X-ray detector of the direct conversion scheme and the flat panel X-ray detector of the indirect conversion scheme. a-Se, a-Te, $PbI_2$, $HgI_2$, etc. can be used for the charge conversion films of the direct conversion scheme.

Figure 2A:
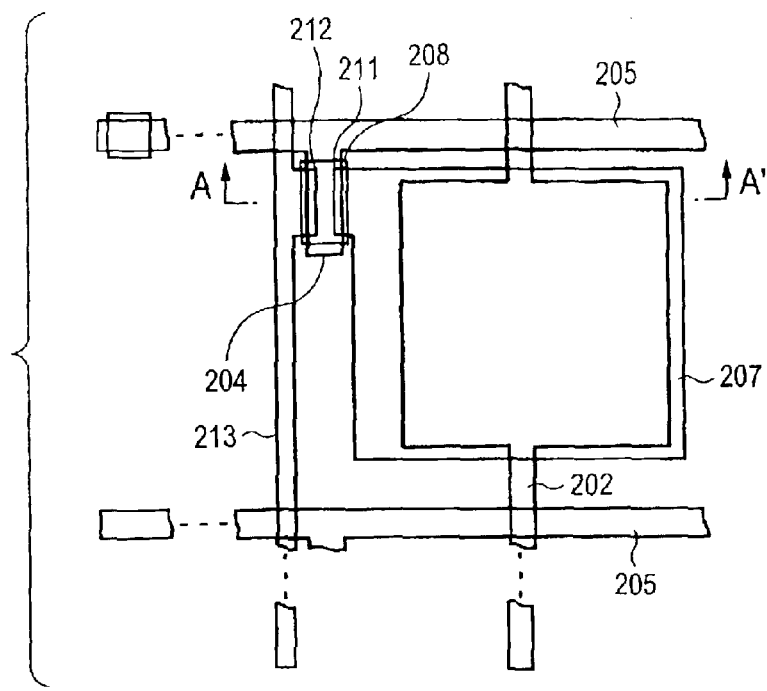
FIGS. 2A and 2B are a pattern wiring view and a sectional view showing the schematic construction of each pixel in the TFT array of the flat panel X-ray detector, respectively.
Figure 2B:
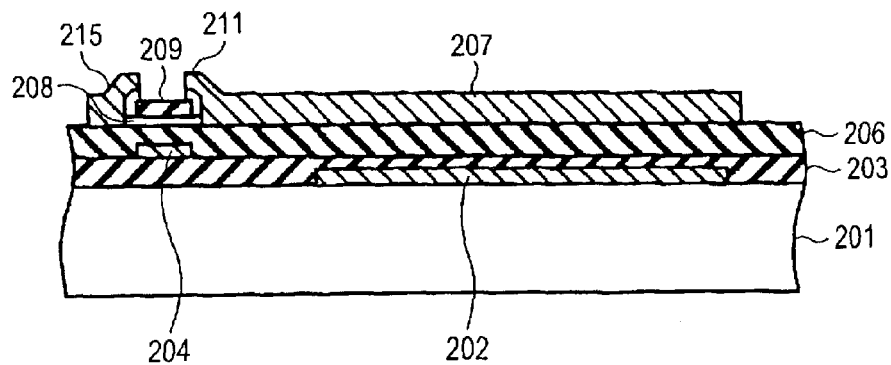

Here, a schematic construction corresponding to one pixel in the TFT array of the flat panel X-ray detector is illustrated in FIGS. 2A and 2B. FIG. 2A is a pattern diagram showing the plan construction of one pixel, while FIG. 2B is a sectional view taken along A-A' indicated in FIG. 2A. Incidentally, since a practicable construction in each pixel of the TFT array is described in detail in Japanese Patent Laid-Open No. 274446/1999, it will be briefly described here.

Referring to FIGS. 2A and 2B, a capacitor line (including a capacitor region) 202 made of molybdenum-tungsten (MoW) is formed on a glass substrate 201, and it is overlaid with a first insulating layer 203 made of a silicon oxide film ($SiO_x$). However, the insulating layer 203 is removed from the contact portion of a voltage feed line (not shown), etc. The gate electrode 204 of a reading a-SiTFT, and a scanning line 205 are formed on the first insulating layer 203, and a leading-out terminal not shown is further formed simultaneously. These constituents are overlaid with a second insulating layer 206 for gate insulation as is made of a silicon oxide film ($SiO_x$). However, the second insulating layer 206 is removed from the through-hole portions of the leading-out terminal portion, etc.

On the second insulating layer 206, a pixel electrode 207 made of an ITO film is formed within the pixel outside the reading a-SiTFT. In a portion where the reading a-SiTFT is formed, the second insulating layer 206 is overlaid with a channel forming layer 208 made of an a-Si film, an $SiN_x$ film 209 for an etching stopper, a source electrode 211, and a drain electrode 212. The pixel electrode 207, a signal line 213, the leading-out pad (not shown), the voltage feed line (not shown), etc. are formed simultaneously with the step of forming the source electrode 211 and the drain electrode 212. A passivation film, an X-ray/charge conversion film, an upper electrode, etc. are formed on a still upper side, but they are omitted from the figures.

In this example, the capacitor line 202 is arranged in parallel with the signal line 213, thereby to decrease a stray capacitance ascribable to the capacitor line 202, and to suppress the influence of coupling ascribable to the intersection between the signal line 213 and the capacitor line 202. Accordingly, noises which are generated in the signal line 213 are reduced.

The groups of terminals (pads) respectively led out from the scanning line, signal line and capacitor line are connected with corresponding circuit devices by a TAB connection method. A practicable example of the connection is shown in FIGS. 3A and 3B.

Referring to FIG. 3A, numeral 301 designates a TFT array substrate, and a large number of pads formed of groups of terminals led out from the TFT array region of the substrate 301 are arrayed on the array forming surface of this substrate (hereinbelow, that region of the substrate in which the pads are arrayed shall be termed the "pad region A"). Besides, numeral 302 designates a TCP, and a pad region B is formed at the end part of the rear surface of the TCP 302. In the pad region B, pads are arrayed having the same terminal width and terminal pitch as in the pad region A on the side of the substrate 301.

In case of connecting the pad region A on the side of the TFT array substrate 301 and the pad region B on the side of the TCP 302, the corresponding terminals a and b are arranged in opposition with an ACF 303 interposed therebetween, and heat and a pressure are applied, as shown in FIG. 3B. The ACF 303 is prepared by mixing conductive particles into a bonding material. When thermocompression bonding is performed, the conductive particles are coupled with one another at only the parts between the close ones of the terminals, whereby the terminals arranged at a high density are electrically connected therebetween.

First Embodiment

The structure of a terminal forming portion in the flat panel X-ray detector of the above construction will be described as the first embodiment of the present invention.

Figure 4:
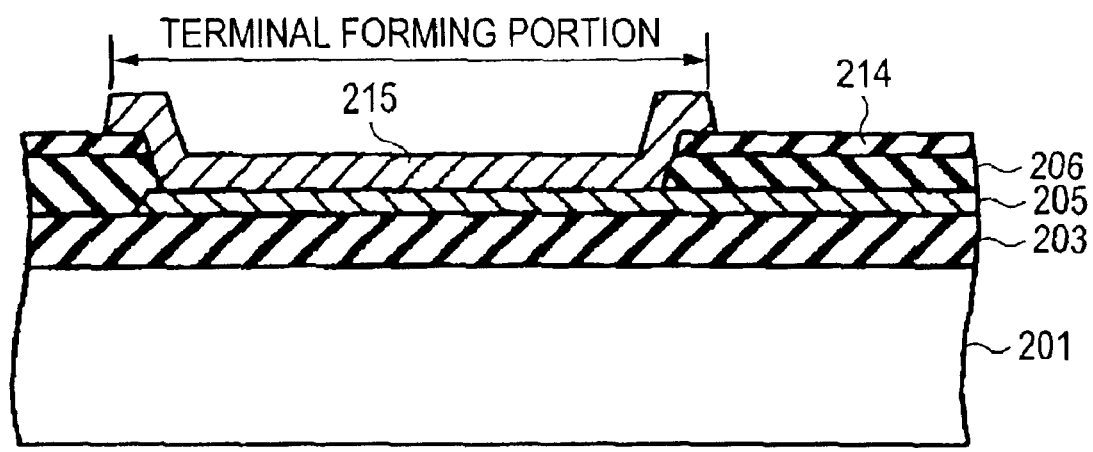
FIG. 4 is a sectional view showing the structure of a terminal forming portion in the TFT array substrate of the flat panel X-ray detector, as the first embodiment of the present invention.

FIG. 4 is a sectional view showing the structure of the terminal forming portion which is led out from the scanning line stated before. By the way, in FIG. 4, the same parts as in FIG. 2B are indicated by the same reference numerals.

Referring to FIG. 4, a first insulating layer 203 made of $SiO_x$ is formed on a glass substrate 201, and a scanning line 205 made of aluminum or an aluminum alloy is disposed on the first insulating layer 203. And a terminal pattern 216 made of a molybdenum alloy is stacked so as to overlap the terminating end part of the scanning line 205 partially. A second insulating layer 206 made of $SiO_x$, and a passivation film (protective layer) 214 made of $SiN_x$ are stacked on the scanning line 205 and the first insulating layer 203 except the terminal forming portion, and an ITO film 215 is stacked on the terminal forming portion. Since such structures can be realized by the same processing steps, terminals formed at the terminating ends of each signal line and each capacitor line are similarly formed.

As stated before, the terminals which are formed at the terminating ends of the scanning lines, signal lines and capacitor lines are put together by every predetermined number and arranged at a high density, and the TAB connection method is employed for the connections between the respective terminals and the corresponding terminals of the circuit devices. Further, when any terminals have been misconnected, the repairing method is resorted to in which the TAB connection is performed again after the TCP has been torn off. Therefore, the material for forming the terminals is limited lest the terminal forming films should peel from the TFT array substrate at the tearing-off of the TCP or at the removal of the ACF.

On the other hand, the scanning lines and the signal lines should desirably be made of a material of lower resistance, for example, aluminum or an aluminum alloy for the purposes of enhancing a scanning drive speed and reducing image noise ascribable to the resistances of the signal lines. The low resistance material such as aluminum alloy, however, weakly couples with a silicon oxide film.

In this embodiment, therefore, the aluminum or the aluminum alloy is used as the material for forming the wiring patterns of the scanning lines and signal lines, the molybdenum alloy which couples with the silicon oxide film more intensely than the aluminum or the aluminum alloy is used as the material for forming the terminal patterns, and the ITO films are stacked on the terminal patterns, whereby the terminal patterns are reinforced and protected against the peeling-off at the tearing-off of the TCP and at the removal of the ACF. MoW which is the same material as that of the capacitor lines can be utilized as the molybdenum alloy.

In the prior-art flat panel X-ray detector based on the TFT array, the TFT driving speed is limited due to the resistances of the scanning lines, and the image noise is at a high level due to the resistances of the signal lines, but the use of a material of low resistance is difficult on account of the restriction of the terminal structure. But, according to the terminal structure of the embodiment, the flat panel X-ray detector can be easily repaired with respect to the external circuit devices while realizing the enhancement of the operating speed and the reduction of the image noise on the basis of the lowered resistances of the scanning lines and the signal lines.

Second Embodiment

Figure 5A:
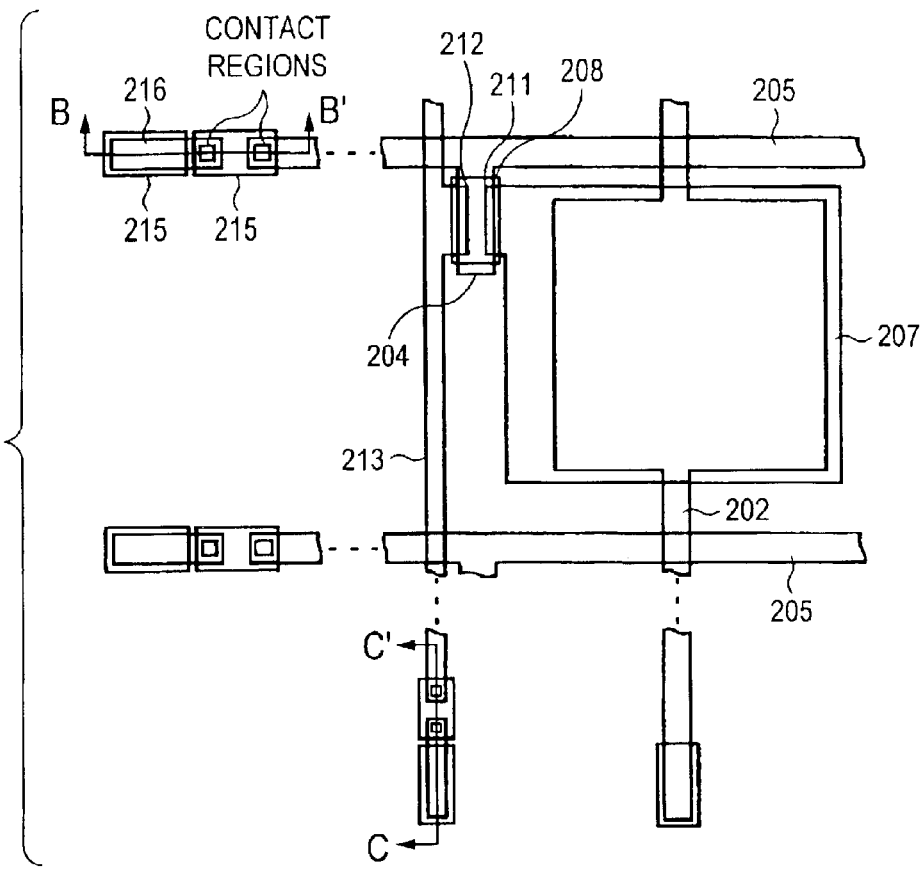
FIGS. 5A and 5B are a pattern wiring view and a sectional view showing the construction of a terminal forming portion in the TFT array substrate of the flat panel X-ray detector, as the second embodiment of the present invention, respectively.
Figure 5B:
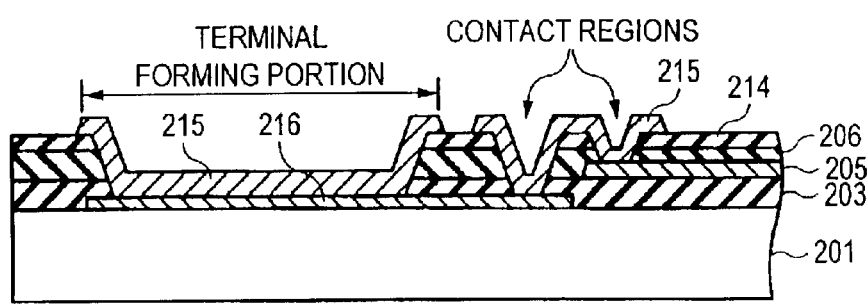

FIGS. 5A and 5B show the construction of a terminal forming portion in the TFT array substrate, as a second embodiment according to the present invention. FIG. 5A is a pattern wiring view showing the plan construction of the terminal forming portion, while FIG. 5B is a sectional view taken along B-B' in the terminal forming portion indicated in FIG. 5A. By the way, in FIGS. 5A and 5B, the same parts as in FIGS. 2A and 2B are indicated by the same reference numerals, and different parts shall be described here.

To be especially noted in this embodiment is that an aluminum alloy which is lower in resistance than MoW is employed for scanning lines and signal lines, while the MoW which intensely couples with a silicon oxide film is employed for the terminal forming portion.

A part B-B' in FIG. 5A is the terminal forming portion at the terminating end of the scanning line. At the part B-B' of the terminal forming portion, as shown in FIG. 5B, a terminal pattern 216 made of an MoW layer is formed on the part of a glass substrate 201 corresponding to the terminal forming portion. The MoW layer forming the terminal pattern 216 is the same layer as that of a capacitor line 202. An end of the terminal pattern 216 is extended beyond a terminal region.

Next, a first insulating layer 203 made of $SiO_x$ is formed on the whole resulting glass substrate 201. On this occasion, the first insulating layer 203 is prevented by masking or the like from being formed on the pad region of the terminal pattern 216 and part of the extension thereof, thereby to form a contact region.

Subsequently, the scanning line 205 made of an aluminum alloy is formed on the first insulating layer 203. The terminating end of the scanning line 205 is brought near to the extended end of the terminal pattern 216. A second insulating layer 206 made of $SiO_x$, and a protective layer 214 made of $SiN_x$ are formed on the scanning line 205. On this occasion, as in the case of the first insulating layer 203, the second insulating layer 206 and the protective layer 214 are prevented from being formed on the terminal region of the terminal pattern 216 and the part of the extension thereof, thereby to form the contact region. At the same time, the second insulating layer 206 and the protective layer 214 are prevented from being also formed on part of the terminating end portion of the scanning line 205, thereby to form a contact region.

An ITO film 215 is stacked on the terminal region of the terminal pattern 216 and the part of the extension thereof. At the same time, the ITO film 215 is also stacked on the contact region at the terminal end portion of the scanning line 205.

Although FIG. 5B is the sectional view taken along the line B-B' indicated in FIG. 5A, the section C-C' of a voltage output terminal forming portion at the terminating end of the signal line as indicated in FIG. 5A is formed with the same structure.

Owing to the adoption of the above structure, the same material MoW as that of the capacitor line 202 can be used as a base material for each terminal. More specifically, the terminal pattern 216 serving as the base part of the terminal is formed of the same MoW layer as that of the capacitor line 202, and each of the signal line 213 and scanning line 205 is extended near the terminal pattern 216 and is connected with the MoW terminal pattern 216 through the ITO film 215 which is the same base material as that of a pixel electrode. On this occasion, the ITO film 215 being the same base material as that of the pixel electrode is stacked also in the terminal region. Thus, a repair facility can be held equal to that of the prior art as a terminal strength is increased.

According to the embodiment, therefore, the noise of imaging signals can be reduced, and the driving speed of TFTs can be enhanced, owing to the lowered resistances of the signal lines and scanning lines, and at the same time, the repair facility can be held equal to that of the prior art because the terminal material can be optimally selected.

Incidentally, Al or an Al alloy (especially, Al—Zr, Al—Nd or Al—Y alloy) are considered as a metal which is used for the scanning lines and the signal lines in each of the foregoing embodiments. Besides, apart from MoW, MoTa (molybdenum-tantalum) is desirable as a material for the capacitor lines and the terminals, from the viewpoint of the repair facility.

Any of $SiO_2$, $SiN_x$ and $SiO_xN_y$ is considered as the material of the gate insulating film, and a stacked structure made of two or more of these materials may well be employed. An inorganic insulating film, for example, $SiO_2$ film or $SiN_x$ film can be used as the passivation film or the inter-layer insulating film, and a stacked structure consisting of the $SiO_2$ and $SiN_x$ films may be also employed. Besides, usable as each TFT is an inverse stagger TFT of etching stopper type, or a TFT of any of a back-channel cut type, etc. Si for forming the TFT may be amorphous silicon and may be poly-silicon. In case of using the poly-silicon, the peripheral circuits may be formed on the same glass substrate. Also in case of this structure, the present invention can be applied to the structure of voltage feed terminals for the drive circuits.

Besides, in case of lowering the resistances of only the signal lines by way of example, not only the capacitor lines, but also the scanning lines are made of the material such as MoW or MoTa, whereby the voltage output terminals on the side of the signal lines can be formed by employing the same layer as that of the scanning lines. Also in case of lowering the resistances of only the scanning lines, the terminals of the scanning lines can be similarly formed.

Further, the present invention is not restricted to the flat panel X-ray detector, but it is applicable to general solid-state imaging devices of flat panel detection type employing photoelectric elements and can bring forth similar advantages.

Additional advantages and modifications will readily occur to those skilled in the art. Therefore, the invention in its broader aspect is not limited to the specific details and representative embodiments shown and described herein. Accordingly, various modifications may be made without departing from the spirit or scope of the general inventive concept as defined by the appended claims and their equivalents.

What is claimed is:

1. A flat panel detection type solid-state imaging device, comprising:
   a flat substrate;
   an array structure which is formed on said flat substrate, and which includes a plurality of conversion pixels for converting incident light or an incident radiation into charges and then storing the charges, a first group of wiring patterns for feeding control signals to the conversion pixels, and a second group of wiring patterns for transferring charges read out from said conversion pixels; and
   terminal structures which are formed on said flat substrate, and each of which includes a terminal pattern for TAB (Tape Automated Bonding) connection which is connected with a terminating end of any of the wiring patterns of the first and second groups of wiring patterns;
   wherein the terminal pattern is formed of a first material which is more difficult to peel off than a second material of said wiring patterns in respect of the TAB connection, and the second material of said wiring patterns has a resistance lower than that of the first material.

2. A flat panel detection type solid-state imaging device according to claim 1, wherein said array structure further includes a third group of wiring patterns which are formed of said first material, and which feed a bias voltage to said conversion pixels.

3. A flat panel detection type solid-state imaging device according to claim 1, wherein:
   each of said conversion pixels includes a capacitor which is formed of said first material, and which serves to store said charges; and
   said terminal patterns are formed at the same layer as that of the capacitors.

4. A flat panel detection type solid-state imaging device according to claim 1, wherein said first material is a molybdenum alloy.

5. A flat panel detection type solid-state imaging device according to claim 4, wherein the molybdenum alloy is a member selected from the group consisting of molybdenum-tungsten (MoW) and molybdenum-tantalum (MoTa).

6. A flat panel detection type solid-state imaging device according to claim 1, wherein said second material is a member selected from the group consisting of aluminum and an aluminum alloy.

7. A flat panel detection type solid-state imaging device according to claim 1, further comprising;
   a protective layer which is stacked on said each terminal pattern, and which is made of indium tin oxide (ITO).

8. A flat panel detection type solid-state imaging device, comprising:
   a flat substrate;
   an array structure which is formed on said flat substrate, and which includes a plurality of conversion pixels for converting incident light or an incident radiation into charges and then storing the charges, a first group of wiring patterns for feeding control signals to the conversion pixels, and a second group of wiring patterns for transferring charges read out from said conversion pixels; and
   terminal structures which are formed on said flat substrate, and each of which includes a terminal pattern for TAB (Tape Automated Bonding) connection as is formed at a position near a terminating end of any of the wiring patterns of the first and second groups of wiring patterns; and
   connection structures which are formed on said flat substrate, and each of which includes a conductive pattern that is stacked on an end part of said terminal pattern and the terminating end of the wiring pattern so as to overlap them partially, and that serves to electrically connect both said terminal pattern and said wiring portion;

wherein the terminal pattern is formed of a first material which is more difficult to peel off than a second material of said wiring patterns in respect of the TAB connection, and the second material of said wiring patterns has a resistance lower than that of the first material.

9. A flat panel detection type solid-state imaging device according to claim 8, wherein said array structure further includes a third group of wiring patterns which are formed of said first material, and which feed a bias voltage to said conversion pixels.

10. A flat panel detection type solid-state imaging device according to claim 8, wherein:

each of said conversion pixels includes a capacitor which is formed of said first material, and which serves to store said charges; and said terminal patterns are formed at the same layer as that of the capacitors.

11. A flat panel detection type solid-state imaging device according to claim 8, wherein said first material is a molybdenum alloy.

12. A flat panel detection type solid-state imaging device according to claim 11, wherein the molybdenum alloy is a member selected from the group consisting of molybdenum-tungsten (MoW) and molybdenum-tantalum (MoTa).

13. A flat panel detection type solid-state imaging device according to claim 8, wherein said second material is a member selected from the group consisting of aluminum and an aluminum alloy.

14. A flat panel detection type solid-state imaging device according to claim 8, further comprising;

a protective layer which is stacked on said each terminal pattern, and which is made of indium tin oxide (ITO).

15. A flat panel detection type solid-state imaging device according to claim 14, wherein the conductive pattern is made of the same material as that of said protective layer.

* * * * *